(12) United States Patent
Larsson et al.

(10) Patent No.: US 9,023,466 B2
(45) Date of Patent: May 5, 2015

(54) TEXTURED ALUMINA LAYER

(75) Inventors: Tommy Larsson, Angelsberg (SE); Mats Johansson, Linkoping (SE)

(73) Assignee: Seco Tools AB, Fagersta (SE)

( * ) Notice: Subject to any disclaimer, the term of this patent is extended or adjusted under 35 U.S.C. 154(b) by 198 days.

(21) Appl. No.: 13/702,714

(22) PCT Filed: Jun. 7, 2011

(86) PCT No.: PCT/EP2011/059365
§ 371 (c)(1),
(2), (4) Date: Jan. 11, 2013

(87) PCT Pub. No.: WO2011/154392
PCT Pub. Date: Dec. 15, 2011

(65) Prior Publication Data
US 2013/0156517 A1    Jun. 20, 2013

(30) Foreign Application Priority Data
Jun. 8, 2010 (EP) .................................. 10165260

(51) Int. Cl.
*C23C 16/00* (2006.01)
*B23B 27/14* (2006.01)
*C23C 16/40* (2006.01)
*C23C 16/455* (2006.01)
*B23C 5/20* (2006.01)

(52) U.S. Cl.
CPC ............. B23B 27/148 (2013.01); C23C 16/403 (2013.01); C23C 16/45523 (2013.01); B23C 5/20 (2013.01)

(58) Field of Classification Search
CPC ................ B23B 27/148; B23B 224/04; B23B 2228/105; B23B 2270/54; C23C 16/0272; C23C 16/403; C23C 30/005

USPC ............ 51/307, 309; 428/336, 698, 701, 702; 427/255.23, 255.28, 29, 255.31, 427/255.39; 407/119
See application file for complete search history.

(56) References Cited

U.S. PATENT DOCUMENTS

| | | | |
|---|---|---|---|
| 5,654,035 A | 8/1997 | Ljungberg et al. | |
| 5,702,808 A | 12/1997 | Ljungberg | |
| 5,766,782 A | 6/1998 | Ljungberg | |
| 5,980,988 A | 11/1999 | Ljungberg | |
| 6,071,601 A * | 6/2000 | Oshika et al. | 428/701 |
| 6,333,103 B1 | 12/2001 | Ishii et al. | |
| 6,713,172 B2 * | 3/2004 | Ljungberg et al. | 51/309 |
| 7,011,867 B2 | 3/2006 | Martensson | |
| 7,094,447 B2 | 8/2006 | Ruppi | |
| 7,135,221 B2 * | 11/2006 | Ruppi et al. | 428/702 |
| 7,163,735 B2 * | 1/2007 | Ruppi | 428/701 |
| 7,306,636 B2 * | 12/2007 | Ljungberg | 51/307 |
| 7,442,431 B2 | 10/2008 | Ruppi | |

(Continued)

OTHER PUBLICATIONS

International Search Report, dated Jul. 22, 2011, from corresponding PCT application.

*Primary Examiner* — Archene Turner
(74) *Attorney, Agent, or Firm* — Young & Thompson

(57) ABSTRACT

A cutting tool insert for machining by chip removal comprising a body of a hard alloy of cemented carbide, cermet, ceramics or cubic boron nitride based material onto which a hard and wear resistant coating is deposited by CVD, and the methods of making and using the same. The coating includes at least one $\alpha$-$Al_2O_3$ layer with a thickness between 0.5 μm and 40 μm having a {01-15} and/or {10-15} texture exhibiting excellent wear and metal cutting performance.

17 Claims, 5 Drawing Sheets

(56) References Cited

U.S. PATENT DOCUMENTS

| | | |
|---|---|---|
| 7,442,432 B2 | 10/2008 | Ruppi |
| 7,455,900 B2 | 11/2008 | Ruppi |
| 7,476,064 B2 * | 1/2009 | Ishii .............................. 407/119 |
| 7,923,101 B2 * | 4/2011 | Ruppi ........................... 428/336 |
| 7,993,742 B2 * | 8/2011 | Ruppi ........................... 428/698 |
| 2007/0104945 A1 | 5/2007 | Ruppi |
| 2008/0187774 A1 | 8/2008 | Ruppi |
| 2013/0212953 A1 * | 8/2013 | Johansson et al. .............. 51/309 |

* cited by examiner

TEXTURED ALUMINA LAYER

BACKGROUND OF THE INVENTION

The present invention relates to a coated cutting tool comprising a body coated with a textured alpha-alumina ($\alpha$-$Al_2O_3$) layer, the method of making and use of the same. The layer is grown by chemical vapour deposition (CVD) and the invention provides an oxide layer with excellent wear properties and good performance in chip forming machining.

Typically, CVD alumina based coatings consist of an inner layer of titanium carbonitride and an outer layer of $\alpha$-$Al_2O_3$. About 15 years ago it was found that further improvements of the alumina layer were possible by controlling the crystallographic orientation of the layer (texture). This was possible by the development of new synthesis routes comprising the use of nucleation and growth sequences, bonding layers, sequencing of the reactant gases, addition of texture modifying agents and/or by using alumina conversion layers. Commonly, the texture is evaluated by the use of X-ray diffraction (XRD) techniques and the concept of texture coefficients.

Textured Alumina Layer Synthesis Using Various Bonding/Nucleation Layers and Growth Sequences U.S. Pat. No. 7,094,447 discloses a method to produce textured $\alpha$-$Al_2O_3$ layers with improved wear resistance and toughness. The $\alpha$-$Al_2O_3$ layer is formed on a (Ti,Al)(C,O,N) bonding layer using a nucleation sequence composed of aluminizing and oxidization steps. The layer is characterized by a strong {012} growth texture as determined by XRD.

U.S. Pat. No. 7,442,431 discloses a method to produce textured $\alpha$-$Al_2O_3$ layers on a (Ti,Al)(C,O,N) bonding layer using a nucleation sequence composed of short pulses and purges of Ti-containing pulses and oxidizing pulses. The layer is characterized by a strong {110} growth texture as determined by XRD.

U.S. Pat. No. 7,455,900 discloses a method to produce textured $\alpha$-$Al_2O_3$ layers on a (Ti,Al)(C,O,N) bonding layer using a nucleation sequence composed of short pulses and purges consisting of Ti+Al pulses and oxidizing pulses. The layer is characterized by a strong {116} growth texture as determined by XRD.

U.S. Pat. No. 7,442,432 discloses a method to produce textured $\alpha$-$Al_2O_3$ layers on a (Ti,Al)(C,O,N) bonding layer with a modified but similar technique as disclosed in U.S. Pat. No. 7,455,900. The layer is characterized by a strong {104} growth texture as determined by XRD.

US 2007104945 discloses a textured $\alpha$-$Al_2O_3$ coated cutting tool insert for which a nucleation controlled, $\alpha$-$Al_2O_3$ layer texture is obtained. The layer is characterized by a strong {006} growth texture as determined by XRD.

US 2008187774 discloses a texture-hardened $\alpha$-$Al_2O_3$ coated cutting tool insert with a {006} growth texture as determined by XRD.

U.S. Pat. No. 6,333,103 discloses a textured $\alpha$-$Al_2O_3$ layer grown on a TiCO bonding layer characterized by a {10$\overline{1}$0} growth texture as determined by XRD.

Textured Alumina Layer Synthesis Using Sequencing of Reactant Gases

U.S. Pat. No. 5,654,035 discloses a body coated with refractory single- or multilayers, wherein specific layers are characterized by a controlled microstructure and phase composition with crystal planes grown in a preferential direction with respect to the surface of the coated body (growth texture). The textured $\alpha$-$Al_2O_3$ layer is obtained by sequencing of the reactant gases in the following order: $CO_2$, CO and $AlCl_3$. The layer is characterized by a strong {012} growth texture as determined by XRD.

U.S. Pat. No. 5,766,782 discloses a cutting tool coated with refractory single- or multilayers including $\alpha$-$Al_2O_3$, wherein specific layers are characterized by a controlled growth texture with respect to the surface of the coated body. The textured $\alpha$-$Al_2O_3$ layer is obtained by sequencing of the reactant gases such that first $CO_2$ and CO are supplied to the reactor in an $N_2$ and/or Ar atmosphere followed by supplying $H_2$ and $AlCl_3$ to the reactor. The layer is characterized by a {104} growth texture as determined by XRD.

Textured Alumina Layer Synthesis Using Texture Modifying Agents

U.S. Pat. No. 7,011,867 discloses a coated cutting tool comprising one or more layers of refractory compounds out of which at least one layer is an $\alpha$-$Al_2O_3$ layer having a columnar grain-structure and a strong {300} growth texture as determined by XRD. The microstructure and texture is obtained by adding $ZrCl_4$ as a texture modifying agent to the reaction gas during growth.

U.S. Pat. No. 5,980,988 discloses a {110} textured $\alpha$-$Al_2O_3$ layer as obtained by using $SF_6$ as a texture modifying agent during growth. The texture is determined by XRD.

U.S. Pat. No. 5,702,808 discloses a {110} textured $\alpha$-$Al_2O_3$ layer as obtained sequencing $SF_6$ and $H_2S$ during growth. The texture is determined by XRD.

Textured Alumina Layer Synthesis Using Conversion Layers

U.S. RE41111 discloses a {001} textured $\alpha$-$Al_2O_3$ layer as obtained using an initial heat treated alumina core layer (conversion layer) with a thickness of 20-200 nm. The texture is determined by electron back scattering diffraction (EBSD).

An explanation of EBSD and the analysis for texture evaluation by using pole figures, pole plots, orientation distribution functions (ODFs) and texture indexes can for instance be found in *Introduction to Texture Analysis: Macrotexture, Microtexture, and Orientation Mapping*, Valerie Randle and Olaf Engler, (ISBN 90-5699-224-4) pp. 13-40.

Typically, the evaluation of texture may comprise
i) construction of the ODF,
ii) identifying the components Euler angles $\phi_1$, $\Phi$ and $\phi_2$ (cf. FIG. 1) and their corresponding ODF densities and texture indexes,
iii) construction of pole figure(s) of relevant texture components and
iv) construction of pole plot(s) of the relevant texture components.

SUMMARY OF THE INVENTION

It is an object of the present invention to provide a texture controlled $\alpha$-$Al_2O_3$ layer deposited by CVD with excellent wear properties and chip forming cutting performance.

It is also an object of the present invention to provide a method of producing the same.

Surprisingly, it has been found that the control of a unique $\alpha$-$Al_2O_3$ layer texture is obtained solely by the growth conditions resulting in layers with advanced metal cutting performance.

BRIEF DESCRIPTION OF THE DRAWINGS

FIG. 4). MUD is the multiples of unit distribution.

DETAILED DESCRIPTION OF THE INVENTION

Figure 1:
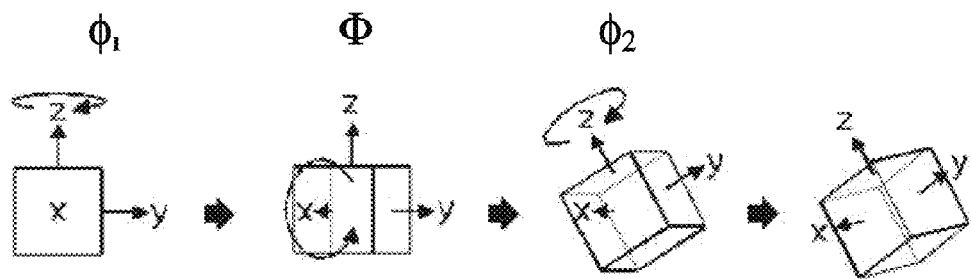
FIG. 1. Definition of the Euler angles $\phi_1$, $\Phi$, and $\phi_2$ used in the ODF representation with respect to the crystallographic orientations.

According to the present invention, there is provided a cutting tool insert for machining by chip removal comprising a body of a hard alloy of cemented carbide, cermet, ceramic, cubic boron nitride based material onto which a hard and wear resistant coating is deposited comprising at least one α-Al$_2$O$_3$ layer, designed with a {01-15} and/or {10-15} texture (crystallographic orientation), preferably with a rotational symmetry (fibre texture), with reference to the surface normal of the coated body.

Said texture exhibits an ODF texture index >1, preferably 1<texture index<50, most preferably 2<texture index<10, and texture components in the ODF representation (Euler space) satisfying the {01-15} and {10-15} solutions with i) {01-15}: 0°≤φ$_1$≤90°, 17°<Φ<47°, preferably 22°<Φ<42°, and 1°<φ$_2$<59°, preferably 10°<φ$_2$<50°, with 1<ODF density<100, preferably 10<ODF density<50, and/or ii) {10-15}: 0°≤φ$_1$≤90°, 17°<Φ<47°, preferably 22°<Φ<42°, and 61°<φ$_2$<119°, preferably 70°<φ$_2$<110°, with 1<ODF density<100, preferably 10<ODF density<50, respectively.

The ODFs are constructed from EBSD data obtained on the ion polished α-Al$_2$O$_3$ top surface layers over a representative area using series expansion with a resolution of 32×32×32 points, a Gaussian half width of 5° and L$_{max}$=34 with a clustering of 5°.

Said α-Al$_2$O$_3$ layer has a thickness between 0.5 μm and 40 μm, preferably between 0.5 μm and 20 μm, most preferably between 1 μm and 10 μm, with a columnar grain structure, all columns with essentially the same column width throughout the layer thickness between 0.2 μm and 5 μm, preferably between 0.2 μm and 2.5 μm, most preferably between 0.2 μm and 1.5 μm, as measured close to the middle of the layer thickness.

Said coating may comprise of an inner single- and/or multilayer coating of, e.g. TiN, TiC or Ti(C,O,N) or other Al$_2$O$_3$ polymorphs, preferably Ti(C,O,N), and/or an outer single- and/or multilayer coating of, e.g. TiN, TiC, Ti(C,O,N) or other Al$_2$O$_3$ polymorphs, preferably TiN and/or Ti(C,O,N), to a total coating thickness 0.5 to 40 μm, preferably 0.5 to 20 μm, and most preferably 1 to 10 μm, according to prior art.

Optionally, said coated body is post treated with, e.g., wet blasting, brushing operation, etc. such that the desired surface quality and/or edge shape is obtained.

The deposition method for the α-Al$_2$O$_3$ layer of the present invention is based on chemical vapour deposition at a temperature between 950° C. and 1050° C. in mixed H$_2$, CO$_2$, CO, H$_2$S, HCl and AlCl$_3$ at a gas pressure between 50 and 150 mbar as known in the art. According to the invention, the CO$_2$/CO gas flow ratio is cyclically varied, upwards and downward, continuously or stepwise between a lower gas flow ratio of 0.3≤(CO$_2$/CO)|$_{low}$≤1.2, preferably 0.5≤(CO$_2$/CO)|$_{low}$≤1.0, and a higher gas flow ratio of 1.8≤(CO$_2$/CO)|$_{high}$≤3.0, preferably 1.8≤(CO$_2$/CO)|$_{high}$≤2.5, with a periodicity between 1 minute and 60 minutes, preferably between 2 minutes and 30 minutes. It is within the purview of the skilled artisan to determine the gas flows and gas mixture in accordance with the present invention.

The invention also relates to the use of cutting tool inserts according to the above for machining by chip removal at cutting speeds between 75 and 600 m/min, preferably between 150 and 600 m/min, with an average feed, per tooth in the case of milling, between 0.08 and 0.8 mm, preferably between 0.1 and 0.6 mm, depending on cutting speed and insert geometry.

EXAMPLE 1

Cemented carbide cutting inserts with the composition 5.5 wt % Co, 8 wt % cubic carbides and balance WC, were initially coated with a 6 μm thick layer of MTCVD Ti(C,N). In subsequent process steps and during the same coating cycle, a 5 μm thick layer of α-Al$_2$O$_3$ was deposited by continuously ramping the gas flow ratio CO$_2$/CO, upwards and downwards, between the process conditions 1 and 2 (see table 1) with a periodicity of 20 minutes.

TABLE 1

| Process Conditions | 1 | 2 |
|---|---|---|
| CO$_2$/% | 1.6 | 5 |
| CO/% | 2 | 2 |
| AlCl$_3$/% | 2 | 2 |
| H$_2$S/% | 0.3 | 0.3 |
| HCl/% | 2 | 2 |
| H$_2$/% | balance | balance |
| Pressure/mbar | 70 | 70 |
| Temperature/° C. | 1000 | 1000 |

EXAMPLE 2

Example 1 was repeated with a constant CO$_2$/CO gas flow ratio of 2.0.

EXAMPLE 3

Layers from example 1 and 2 were characterized by SEM and EBSD using a LEO Ultra 55 scanning electron microscope operated at 15 kV and equipped with a HKL Nordlys II EBSD detector. The commercial Channel 5 software version 5.0.9.0 was used for data collection. The same software was used for data analyses: calculations of ODFs, i.e. the Euler angles and densities as well as texture indexes, pole figures, and pole plots. Samples for EBSD were obtained by ion polishing the top surface of the α-Al$_2$O$_3$ layers using a JEOL SM-09010 Cross Section Polisher system.

Figure 2A:
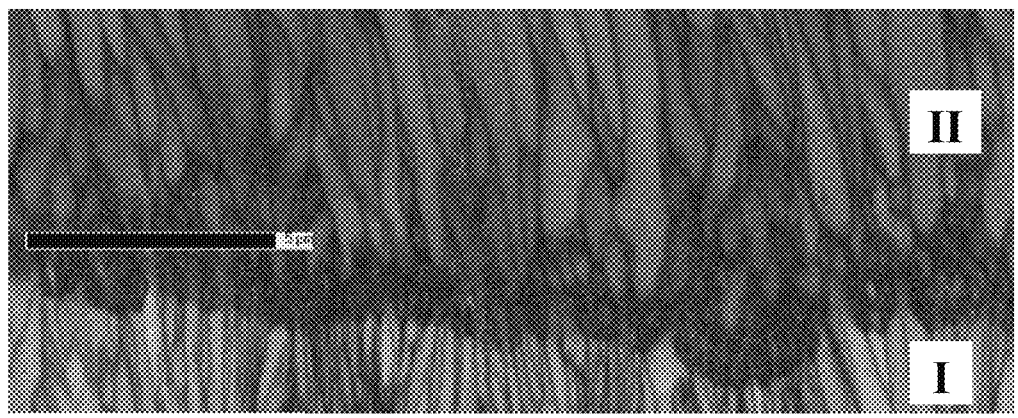
FIG. 2. Back scattered SEM micrographs of ion polished cross sections of a) a {01-15} textured $\alpha$-$Al_2O_3$ layer (II) and Ti(C,N) layer (I) according to the invention and b) a {001} textured α-Al$_2$O$_3$ layer (II) and Ti(C,N) layer (I) according to prior art.
Figure 2B:
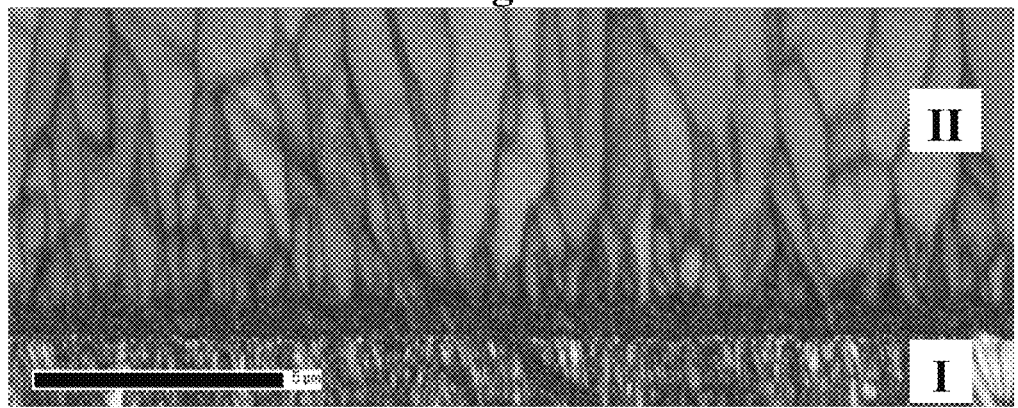

FIG. 2 shows back scattered SEM micrographs of ion polished cross sections of the α-Al$_2$O$_3$ layers, marked with II in the images, for a) example 1 (invention) and b) example 2 (reference). Both layers exhibit a columnar grain structure. The invention layers show a column width ranging between 0.2 μm and 1.7 μm which is more narrow than the column width of the reference layers.

Figure 3A:
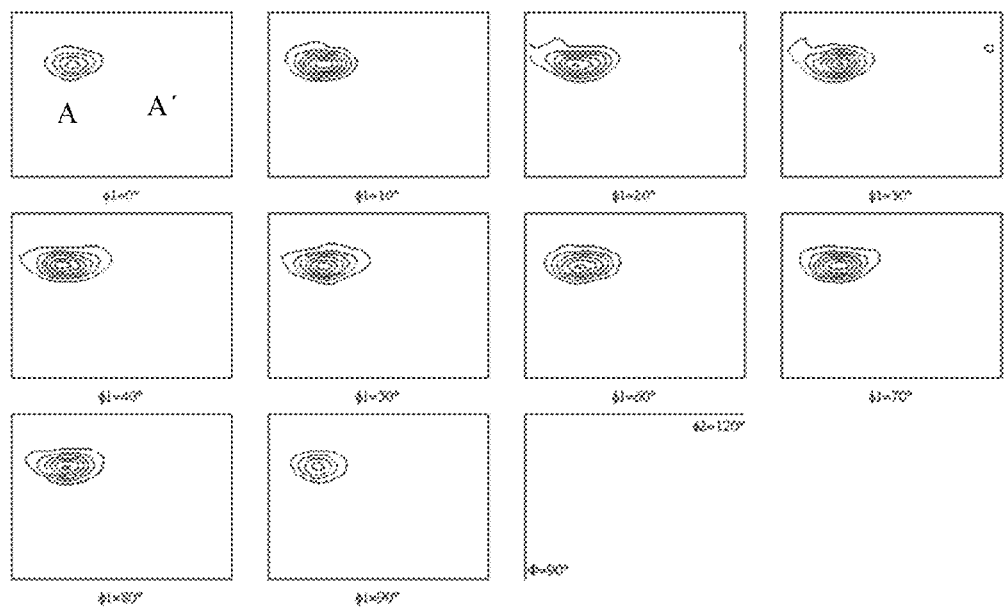
FIG. 3. ODF contour charts (ODF Euler angles and densities) of a) a {01-15} textured α-Al$_2$O$_3$ layer according to the invention with the {01-15} and {10-15} solutions marked with A and A', respectively and b) a {0001} textured α-Al$_2$O$_3$ layer according to prior art.
Figure 3B:
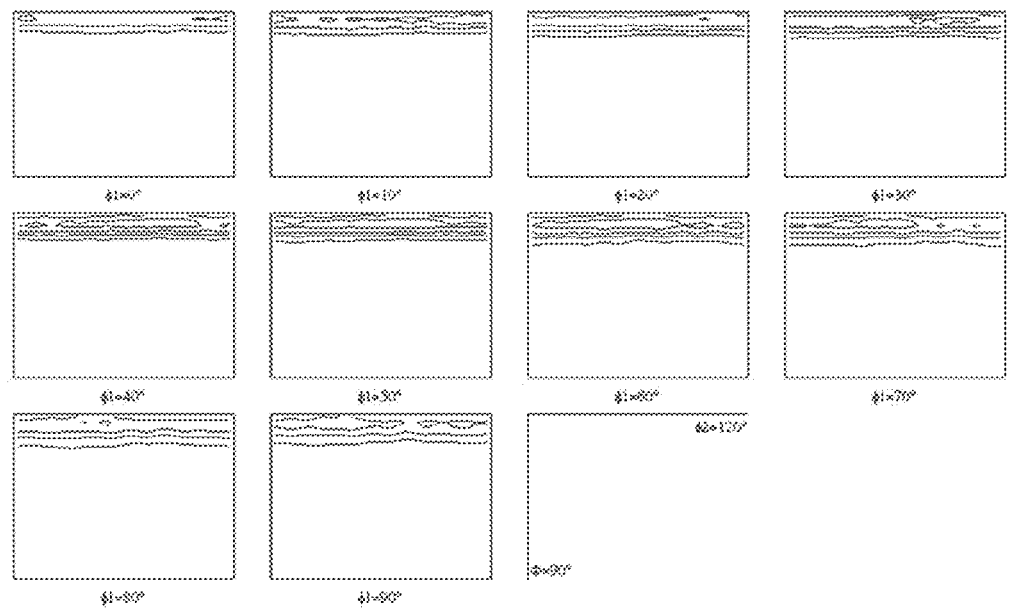

FIG. 3 shows ODF contour charts (ODF Euler angles and densities) as deduced from the EBSD data of a) a textured α-Al$_2$O$_3$ layer from example 1 with the {01-15} and {10-15} solutions marked with A and A', respectively, with a texture index of 6.3, and b) a {0001} textured α-Al$_2$O$_3$ layer of example 2 with a texture index of 5.5. The Euler angles $\phi_1$, $\Phi$ and $\phi_2$ for the {01-15} texture component are centred (highest ODF density) at about $0°\leq\phi_1\leq90°$, $\Phi$ at about 30°, and $\phi_2$ at about 30° and for the {10-15} texture component at about $0°\leq\phi_1\leq90°$, $\Phi$ at about 30°, and $\phi_2$ at about 90°. From the Channel 5 software, an ODF density value of 23 for {01-15} was obtained. The results demonstrate a {10-15} fibre texture of the layer in example 1.

In addition, pole figures and pole plots of the fibre textures were plotted.

Figure 4A:
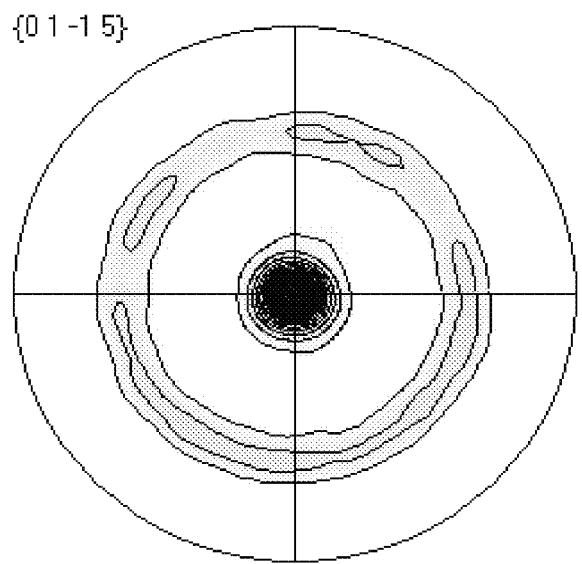
FIG. 4. EBSD pole figures of a) {01-15} texture component according to the invention, b) {10-15} texture component according to the invention and c) {0001} textured α-Al$_2$O$_3$ layer according to prior art.
Figure 4B:
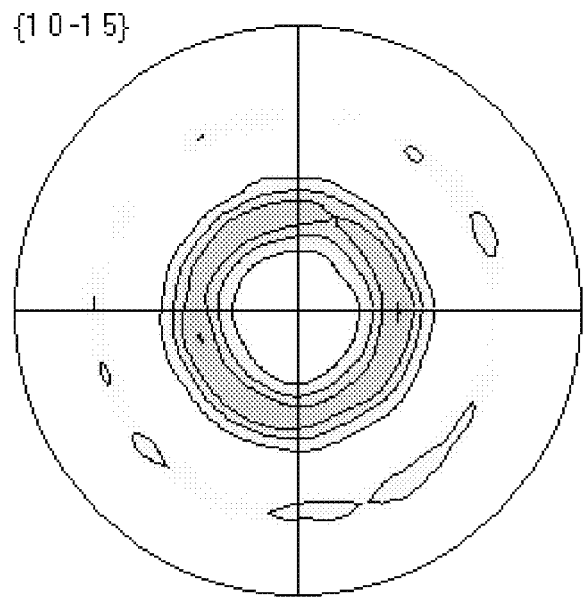
Figure 4C:
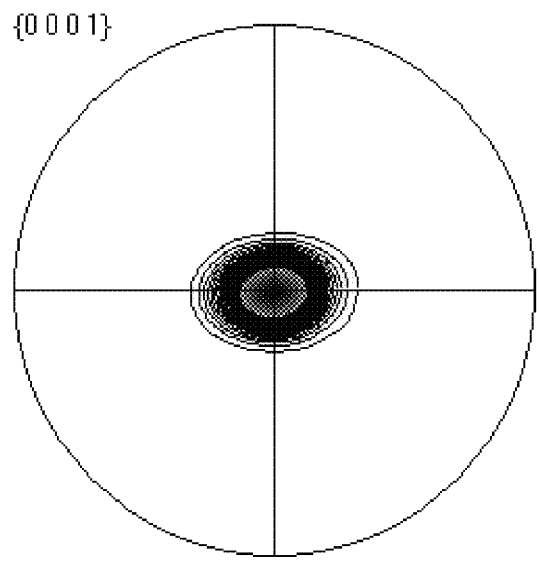

FIG. 4 shows pole figures of a) the {01-15} and b) the {10-15} texture components of the layer from example 1. FIG. 4 c) shows the pole figure of example 2.

Figure 5A:
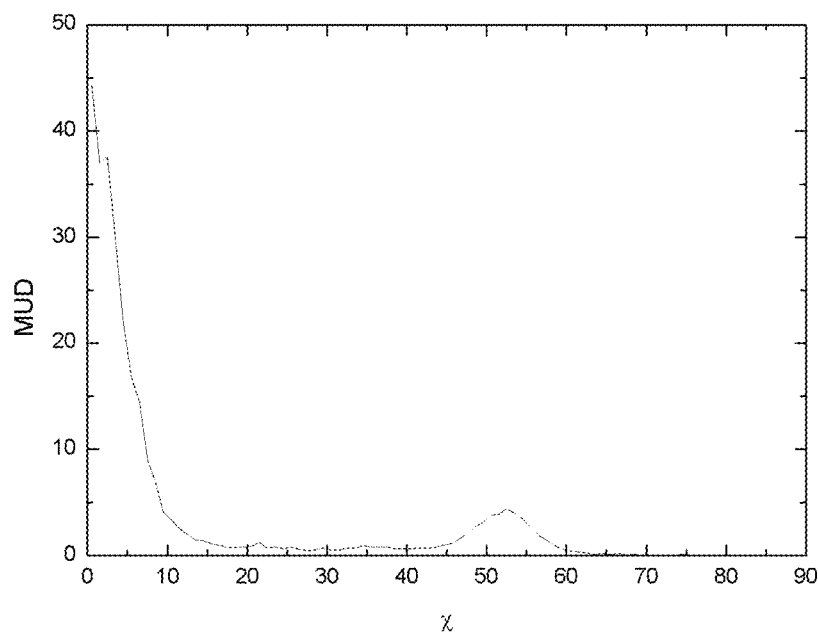
FIG. 5. EBSD pole plots of a) {01-15} texture component according to the invention, b) {10-15} texture component according to the invention and c) {0001} textured α-Al$_2$O$_3$ layer according to prior art. χ is the angle from the centre (χ=0) to the rim (χ=90) of the pole figures (cf.
Figure 5B:
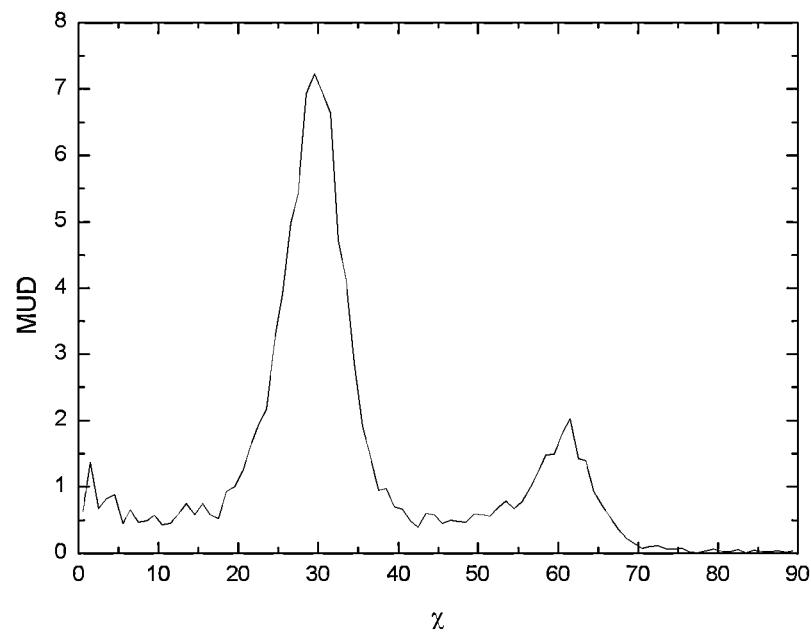
Figure 5C:
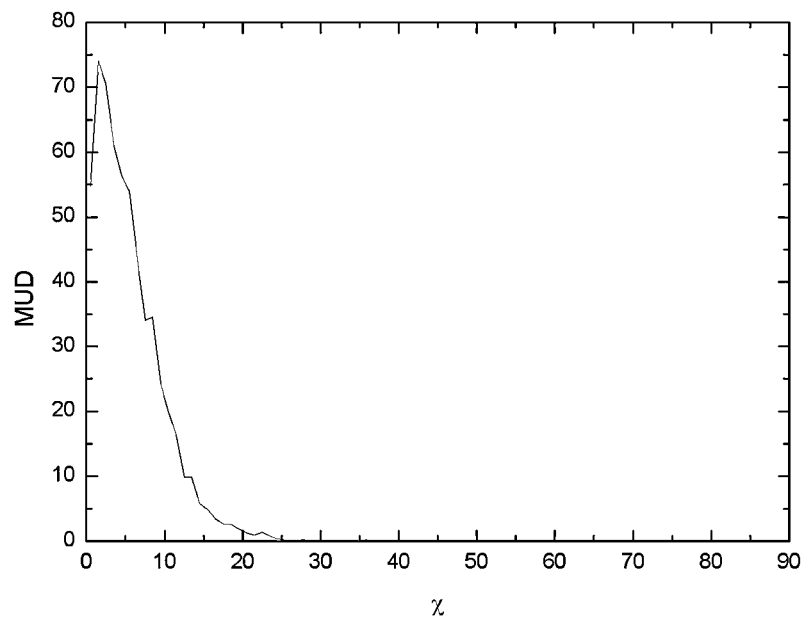

FIG. 5 shows pole plots of a) the {01-15} and b) the {10-15} texture components of the layer from example 1. FIG. 5 c) shows the pole plot of example 2. $\chi$ is the angle from the centre ($\chi$=0) to the rim ($\chi$=90) of the pole figures in FIG. 4. MUD is the multiples of unit distribution.

EXAMPLE 4

Coated inserts from example 1 and example 2 together with competitor grades were tested in a continuous turning application at the following cutting conditions.

Work piece: Cylindrical bar
Material: Ck45
Insert type: CNMG120408
Cutting speed: 400 m/min
Feed: 0.45 mm/rev
Depth of cut: 2.0 mm
Remarks: Coolant Measurements of edge wear, Vb, in mm after 12 minutes time in cut are shown in table 2.

TABLE 2

| Sample | Vb (mm) |
| --- | --- |
| Invention: example 1 | 0.15 |
| Reference: example 2 | 0.20 |
| Competitor X | >1 (edge break down) |
| Competitor Y | >1 (edge break down) |
| Competitor Z | 0.27 mm |

The invention claimed is:

1. A cutting tool insert for machining by chip removal, comprising:
a body of a hard alloy of cemented carbide, cermet, ceramics or cubic boron nitride based material onto which a hard and wear resistant coating is deposited by CVD comprising at least one α-Al$_2$O$_3$ layer with a thickness between 0.5 μm and 40 μm, wherein said α-Al$_2$O$_3$ layer is {01-15} and/or {10-15} textured.

2. The cutting tool insert according to claim 1, wherein said texture is fiber textured.

3. The cutting tool insert according to claim 1, wherein said texture has an ODF texture index >1.

4. The cutting tool insert according to claim 1, wherein said texture exhibits texture components in the ODF representation with 1<ODF density<100, satisfying one or both of the {01-15} and {10-15} solutions with Euler angles
i) $0°<\phi_1<90°$, $17°<\Phi<47°$ and $1°<\phi_2<59°$ and
ii) $0°<\phi_1<90°$, $17°<\Phi<47°$ and $61°<\phi_2<119°$.

5. The cutting tool insert according to claim 4, wherein
i) $0°<\phi_1<90°$, $22°<\Phi<42°$ and $10°<\phi_2<50°$ and
ii) $0°<\phi_1<90°$, $22°<\Phi<42°$ and $70°<\phi_2<110°$.

6. The cutting tool insert according to claims 4, wherein 10<ODF density<50.

7. The cutting tool insert according to a claim 1, wherein said α-Al$_2$O$_3$ layer has a columnar grain structure, all columns essentially with the same column width between 0.2 μm and 5 μm throughout the layer thickness.

8. The cutting tool insert according to claim 7, wherein said column width is between 0.2 μm and 2.5 μm throughout the layer.

9. The cutting tool insert according to claim 1, wherein said coating comprises of an inner single- and/or multilayer coating of TiN, TiC or Ti(C,O,N) or other Al$_2$O$_3$ polymorphs, and/or an outer single- and/or multilayer coating of TiN, TiC, Ti(C,O,N) or other Al$_2$O$_3$ polymorphs, to a total thickness 0.5 to 40 μm.

10. A method for machining of a work piece by chip removal, comprising:
contacting the work piece to the cutting tool insert according to claim 1 at cutting speeds between 75 and 600 m/min, with an average feed, per tooth in the case of milling, between 0.08 and 0.8 mm, depending on cutting speed and insert geometry.

11. A method for machining of a work piece by chip removal, comprising:
contacting the work piece to the cutting tool insert according to claim 1 at cutting speeds between 150 and 600 m/min, with an average feed, per tooth in the case of milling, between 0.1 and 0.6 mm, depending on cutting speed and insert geometry.

12. The cutting tool insert according to claim 1, wherein said texture has an ODF texture index 1<texture index<50.

13. The cutting tool insert according to claim 1, wherein said coating comprises of an inner single- and/or multilayer coating of Ti(C,O,N), and/or an outer single- and/or multilayer coating of TiN and/or Ti(C,O,N), to a total thickness 0.5 to 20 μm.

14. A method of making a cutting tool insert comprising a body of cemented carbide, cermet, ceramics or cubic boron nitride based material, comprising:
depositing onto which a hard and wear resistant coating comprising at least one α-Al$_2$O$_3$ layer by chemical vapour deposition at a temperature between 950° C. and 1050° C. in mixed H$_2$, CO$_2$, CO, H$_2$S, HCl and AlCl$_3$ at a gas pressure between 50 and 150 mbar, wherein a CO$_2$/CO gas flow ratio is cyclically varied, upwards and downward, continuously or stepwise between a lower gas flow ratio of 0.3<(CO$_2$/CO)|$_{low}$<1.2 and a higher gas flow ratio of 1.8<(CO$_2$/CO)|$_{high}$<3.0 with a periodicity between 1 minute and 60 minutes.

15. The method of making a cutting tool insert according to claim 14, wherein said lower gas flow ratio is 0.5<(CO$_2$/CO)|$_{low}$<1.0 and a higher gas flow ratio is 1.8<(CO$_2$/CO)|$_{high}$<2.5.

16. The method of making a cutting tool insert according to claim 14, wherein the periodicity is between 2 minutes and 30 minutes.

17. The method of making a cutting tool insert according to claim 14, wherein said α-Al$_2$O$_3$ layer is {01-15} and/or {10-15} textured.

* * * * *